United States Patent [19]
Glatfelter et al.

[11] Patent Number: 5,228,926
[45] Date of Patent: * Jul. 20, 1993

[54] PHOTOVOLTAIC DEVICE WITH INCREASED LIGHT ABSORPTION AND METHOD FOR ITS MANUFACTURE

[75] Inventors: Troy Glatfelter, Royal Oak; Craig Vogeli, New Baltimore; Jon Call, Royal Oak; Ginger Hammond, Imlay City, all of Mich.

[73] Assignee: United Solar Systems Corporation, Troy, Mich.

[*] Notice: The portion of the term of this patent subsequent to May 5, 2009 has been disclaimed.

[21] Appl. No.: 776,659

[22] Filed: Oct. 15, 1991

Related U.S. Application Data

[63] Continuation-in-part of Ser. No. 585,661, Sep. 20, 1990, Pat. No. 5,110,370.

[51] Int. Cl.[5] .................... H01L 31/052; H01L 31/18
[52] U.S. Cl. .................................. 136/259; 136/244; 136/256; 136/246; 136/258; 437/2
[58] Field of Search ................................ 437/2-5; 136/244, 246, 256, 259

[56] References Cited

U.S. PATENT DOCUMENTS

| | | | |
|---|---|---|---|
| 3,973,994 | 8/1976 | Redfield | 136/259 |
| 4,053,327 | 10/1977 | Meulenberg | 136/256 |
| 4,072,541 | 2/1978 | Meulenberg | 136/255 |
| 4,379,202 | 4/1983 | Chalmers | 136/256 |
| 4,453,030 | 6/1984 | David | 136/256 |
| 4,608,451 | 8/1986 | Landis | 136/256 |
| 5,110,370 | 5/1992 | Vogeli et al. | 136/256 |

OTHER PUBLICATIONS

"Solar Cells for Solar Power Satellites", H. Oman, Boeing Aerospace Company, pp. 133-138, Proc. European Symposium on Photovoltaic Generators in Space (ESTEC), Noordwijk (1978).

"Improvements in Silicon Concentrator Cells", published in *Proceedings of the Fourth Int'l Photovoltaic Science and Engineering Conference* Feb. 14-17, 1989, vol. 2, p. 581.

*Primary Examiner*—Aaron Weisstuch
*Attorney, Agent, or Firm*—Krass & Young

[57] ABSTRACT

A photovoltaic cell having a light-directing optical element integrally formed in an encapsulant layer thereof. The optical element redirects light to increase the internal absorption of light incident on the photovoltaic device.

20 Claims, 3 Drawing Sheets

5,228,926

PHOTOVOLTAIC DEVICE WITH INCREASED LIGHT ABSORPTION AND METHOD FOR ITS MANUFACTURE

RIGHTS UNDER GOVERNMENT CONTRACT

The Government of the United States of America has rights in this invention pursuant to subcontract No. ZM-1-19033-2 awarded by the U.S. Department of Energy.

RELATED APPLICATIONS

This application is a continuation-in-part of U.S. patent application Ser. No. 585,661, filed Sep. 20, 1990, now U.S. Pat. No. 5,110,370.

FIELD OF THE INVENTION

This invention relates generally to photovoltaic devices and, more specifically, to photovoltaic devices with increased efficiency resultant from an increase in absorption of light incident thereon.

BACKGROUND OF THE INVENTION

Photovoltaic energy is becoming a very significant power source for several reasons. Fossil fuels are becoming scarcer, and hence more expensive, every day. Furthermore, the burning of fossil fuels releases pollutants and various greenhouse gases which harm the environment. Also, recent events have raised questions as to the safety and cost-effectiveness of nuclear power. For these reasons, traditional energy sources have become far less attractive. Photovoltaic energy, on the other hand, is inherently non-polluting, safe and silent. In addition, recent advances in photovoltaic technology have significantly increased the efficiency, and decreased the cost, of photovoltaic devices.

For example, it is now possible to manufacture large area silicon and/or germanium alloy materials which manifest electrical, optical, chemical, and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Examples of particular fluorinated semiconductor alloy materials having significant utility in fabrication of photovoltaic devices are described in U.S. Pat. No. 4,226,898 and U.S. Pat. No. 4,217,374, both invented by Ovshinsky et al, the disclosures of which are incorporated herein by reference.

In a typical large area photovoltaic device, a number of current-collecting structures are employed to convey photo-generated current to a terminal or other collection point. As used herein, these various structures will be referred to as "current-collecting grids" or "gridlines," these terms being understood to include both grids and bus bars as well as any other opaque conductors associated with the light incident side of photovoltaic devices. Current-collecting grids are necessary to withdraw power from the photovoltaic device.

In a photovoltaic device, it is important to maximize the absorption of light incident to maximize the electrical output of the device. The current collecting grids, however, are typically opaque since they are made of high electrical conductivity material such as deposited metal patterns, adhesively adhered metal tapes, metal-containing pastes, metallic inks, or plated layers. The gridlines shade underlying portions of the photovoltaic device, thereby preventing it from absorbing light energy and generating power. Clearly, the gridlines are needed to allow for the efficient withdrawal of photo-generated current, but their presence also detracts from the overall efficiency of the cell. The lines can be made smaller; however, this increases their electrical resistance and thereby tends to decrease cell efficiency. Under the constraints of the prior art, a designer of photovoltaic devices is caught in a dilemma of having to balance the electrical resistance of the cell versus the amount of active area presented for illumination.

In some instances, prior art cells relied upon the use of relatively thin deposits of high conductivity metals such as pure gold, silver, or copper to provide high conductivity, relatively small area gridlines. However, such approaches require the use of sophisticated photolithographic techniques for patterning the gridlines. Additionally, the length of such thin gridlines was limited by the need to avoid high resistivity; consequently, this approach is limited in size and is quite expensive. Lower cost, easier to apply gridlines prepared from paste or ink material are quite desirable; however, they are of lower conductivity and hence must be made fairly thick and wide to achieve sufficient current carrying capabilities. Such materials were not heretofore practical since the gridlines they provide create a high level of shading.

Various attempts have been implemented in the prior art to employ optical systems to concentrate light in areas remote from gridlines. Such approaches involve the use of prismatic arrays and the like. These arrays are typically supported in a spaced-apart relationship with the photovoltaic device or they are adhesively affixed to the light incident side of the device and, when properly aligned, redirect light falling in the region of gridlines to grid-free portions of the device. This technology is typically employed in conjunction with concentrator cells. An overview of this technology is presented by Zhao et al in a paper entitled "Improvements in Silicon Concentrator Cells," published in the Proceedings of the 4th International Photovoltaic Science and Engineering Conference, Sydney, Australia, Feb. 14-17, 1989, Vol. 2, p 581. Use of a Fresnel, lenticular concentrator is also disclosed in U.S. Pat. No. 4,711,972. These prior art approaches employ fairly precise, molded lenses which must either be adhesively affixed to a photovoltaic cell or mounted in a support frame spaced apart from the photovoltaic cell in proper alignment. Use of lenses of this type requires skill in placement and affixation. If the lenses are misaligned, they will be worse than useless since they will direct light to, rather than away from, the gridlines. In use, conditions such as ambient heat and/or mechanical impact can misalign the lens element, thereby decreasing cell efficiency.

It is also important in maximizing the absorption of light to prevent light incident on the photovoltaic device from being reflected away from the photovoltaic device prior to being absorbed therein. Such reflectance can occur either upon initial incidence of the light onto the outer photovoltaic cell surface or after an initial pass through the photovoltaic device. In either event, light energy which reflects outwardly away from the cell is unused and therefore detracts from overall efficiency of the photovoltaic cell.

What is needed is a photovoltaic device having decreased shading from gridlines, which device does not necessitate the precise placement and adhesive affixation of a separate lens element.

Another problem which decreases the efficiency of photovoltaic devices is the reflection of incident light from the surface thereof. A light beam striking the cell will be partially absorbed and partially reflected and the reflected light represents a loss in efficiency; thus it is clearly desirable to minimize reflection as much as possible. Anti-reflective coatings, which comprise transparent layers of varying thicknesses have been used in optical devices for some time to increase the overall absorption of light at a particular wavelength. Such layers are of precise composition and thickness and hence are difficult and expensive to fabricate. Also, anti-reflective coatings operate optimally at particular wavelengths and are not operative to decrease the reflection of broad band illumination.

Another approach to decreasing reflection is disclosed in various of the references mentioned hereinabove and this method comprises affixing a series of light redirecting elements to the upper surface of a cell. As noted in combination with the use of such elements for decreasing gridline shading, their use necessitates alignment and affixation steps and is generally not compatible with the large scale production of low cost, thin film devices.

In accord with another embodiment of the present invention, a series of light redirecting elements may be directly embossed into the front surface of a photovoltaic device so as to increase the light absorbed thereby in a process integral with device manufacture.

The method of the present invention may be adapted for the manufacture of single cells as well as for the manufacture of modules comprised of interconnected cells. These and other advantages of the present invention will be readily apparent from the drawings, discussion and description which follow.

SUMMARY OF THE INVENTION

There is disclosed herein a method of manufacturing a photovoltaic device having increased absorption of light incident thereon. The method includes the steps of providing a photovoltaic cell which includes a bottom electrode layer, a photovoltaic body disposed atop the bottom electrode layer and a top electrode layer disposed atop the photovoltaic body. The method further includes the steps of disposing a layer of embossable, transparent, organic, polymeric, encapsulating material directly atop the top electrode layer, providing an embossing die which includes a plurality of groove forming elements disposed in a pattern thereon, and aligning the die with the photovoltaic cell so that the elements are in contact with the layer of encapsulating material and adapted to form a pattern of light directing grooves over substantially all of the active area of the cell. The method further includes the steps of compressing the embossing die and photovoltaic cell so as to emboss a pattern into the encapsulant layer covering substantially all of the active area of the cell and the final step of removing the embossing die. In this manner, there is provided a photovoltaic cell having a pattern formed integrally with the encapsulating layer. The pattern is operable to direct incident illumination so as to increase internal absorption thereof.

In particular embodiments, the pattern forming elements on the embossing die are configured as a plurality of groove-forming elements arranged substantially parallel to one another. In another embodiment, the substantially parallel groove forming elements are arranged adjacent one another so as to form a substantially continuous pattern of parallel grooves in the encapsulating material. This minimizes and, more preferably, eliminates, surfaces of the encapsulating material which are oriented parallel to the underlying electrode layers and maximizes light absorption as will be described hereinbelow. One or more of these grooves may be aligned with underlying current collecting grid structures to minimize gridline shading; however, each groove need not have an associated grid element.

In particular embodiments, the transparent embossable layer is a layer of synthetic organic polymer material such as ethylene vinyl acetate, polytetrafluoroethylene, polyvinyl fluoride, polyvinyl acetate, polystyrene, polyurethane and combinations thereof. In other particular embodiments, a two step process is carried out wherein the cell and encapsulant are first laminated to provide a self-supporting structure which is subsequently embossed (and optionally cross-linked) in a second step. In some embodiments, the embossing die is heated and compression is carried out at pressures of approximately one atmosphere. In a particular embodiment, the layer of transparent polymeric material is a layer of thermally cross-linkable material and it becomes hardened while the groove is embossed.

The method of the present invention may be adapted to the manufacture of large area modules comprised of a plurality of interconnected cells and includes the initial step of disposing a plurality of photovoltaic cells onto a support member and encapsulating those cells with a layer of transparent encapsulant material. The method includes a further step of providing a plurality of embossing dies, each including a plurality of pattern-forming elements, as well as the steps of aligning the dies with corresponding photovoltaic cells and compressing the dies and cells. Alignment may be accomplished by punching alignment holes into the support portion of the module and providing the dies with pins configured to fit in the holes. In this manner, the dies may be aligned properly with regard to individual strip cells thereby eliminating problems resulting from slight misalignment between individual cells.

The present invention further includes an improved photovoltaic cell manufactured according to the method and including an optical element formed integral with the encapsulant layer.

DETAILED DESCRIPTION OF THE INVENTION

Figure 1:
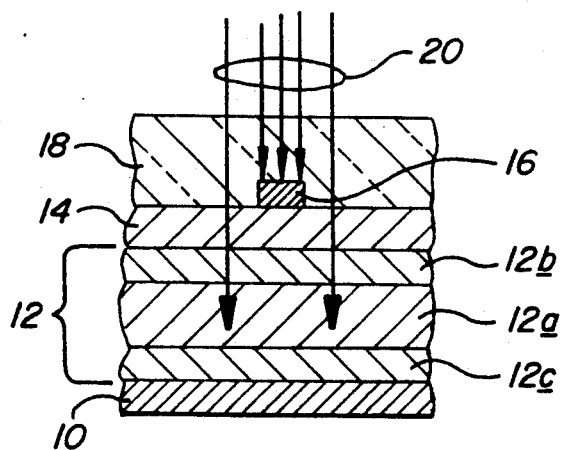
FIG. 1 is a cross-sectional view of a portion of a photovoltaic cell of the prior art illustrating the problem of gridline shading.

Referring now to FIG. 1, there is shown a cross-sectional view of a portion of a photovoltaic cell of the prior art illustrating the problem of gridline shading. The cell includes a substrate 10, which in this instance is a metallic substrate which also functions as a bottom electrode layer. Disposed immediately atop the electrically-conductive substrate 10 is a body of photovoltaic material 12 and immediately thereatop on the light incident side of the photovoltaic body 12, is a top electrode layer 14. The top electrode layer 14 is most preferably fabricated from a transparent material so as to permit passage of light therethrough. Associated with the top electrode layer 14 is a gridline 16 which operates to collect current from the top electrode layer 14 and carry it to a bus bar or other terminal. The top, i.e. light incident, surface of the photovoltaic device is protected by a layer of transparent, encapsulant material 18.

There are a great variety of materials which may be utilized to manufacture the photovoltaic devices of the present invention. The bottom electrode layer is fabricated from an electrically-conductive material and as noted hereinabove, may also function as a support substrate for the device. Toward that end, one preferred material is stainless steel of approximately 8 mils thickness. Other substrates include electrically-insulating materials such as polymeric bodies, glass or ceramics and, in such instances, the electrode layer will be deposited thereatop. The photovoltaic body 12, as is well known to those of skill in the art, operates to absorb incident photons and to generate electron-hole pairs in response thereto, and to separate the members of these pairs and direct them to the respective electrodes 10,14 of the cell. There are a great variety of photovoltaic materials known to those of skill in the art and the present invention is not limited to any one such material. Among some of the preferred materials are the thin film materials such as the fluorinated silicon and germanium alloys referred to hereinabove as well as cadmium telluride, gallium arsenide, copper indium diselenide, single crystal silicon and the like. In one particularly preferred embodiment, the photovoltaic body comprises at least one triad of silicon alloy material which includes a layer of intrinsic material 12a interposed between N-type 12b and P-type 12c alloy materials. In one preferred embodiment, at least one of the N-type 12b and P-type layers 12c is a microcrystalline layer, preferably the layer proximate the light incident side of the photovoltaic device. In some instances, a number of triads of N-I-P (or P-I-N) type materials are stacked one atop another to provide for enhanced efficiency and sensitivity.

The top electrode layer 14, as noted hereinabove, is preferably a transparent body and there are available a number of highly degenerate semiconductors such as indium-tin oxide and the like which may be employed as top electrode layers. The gridline 16 is preferably fabricated from an electrically-conductive ink or paste or it may be a metallic body adhered to the top electrode layer. In some instances, the gridline 16 is placed beneath or embedded within the top electrode layer 14. For this reason, and within the context of the present invention, the gridline 16 is described as being electrically associated with the top electrode layer 14. The layer of encapsulant material 18 protects the components of the photovoltaic cell from the ambient environment and from mechanical damage. The encapsulant layer 18 is preferably fabricated from a material which is highly transparent and inert. Organic polymers comprise the most preferred materials for this layer and ethylene vinyl acetate (EVA) is one particularly preferred material. Cross-linkable ethylene vinyl acetate having particular utility in the present invention is sold by the Du Pont de Nemours, E.I. & Company. Other preferred materials include fluorocarbon polymers, polyurethane, polystyrene, and polyvinyl acetate as well as various silicon compounds. In some instances, a bi-layered structure of fluoropolymer/EVA is employed.

FIG. 1 illustrates the manner in which prior art photovoltaic cells suffered from problems of gridline shading. As will be noted, a photon flux 20 is shown as incident upon the device. Those photons which strike the gridline 16 are absorbed, or in some instances reflected, and hence not available to penetrate the photovoltaic body and generate charge carriers. These photons effectively represent a loss in the efficiency of the cell.

Figure 2:
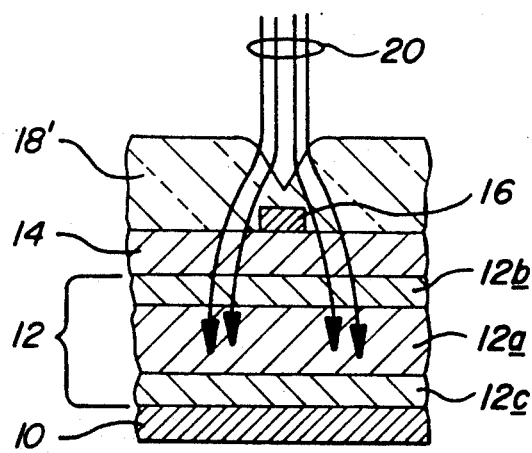
FIG. 2 is a cross section of a portion of a photovoltaic cell configured in accordance with the principles of the present invention and illustrating the manner in which the present invention operates to minimize gridline shading.

Referring now to FIG. 2, there is shown a photovoltaic device generally similar to that of FIG. 1, but including the improvement of the present invention which comprises a transparent encapsulating layer 18' configured to include an integral optical element in the form of a groove disposed in the region of the gridline 16. The particularly configured transparent encapsulant layer 18' operates to refract incident light 20 away from the gridline 16 and into the photovoltaic body 12. In this manner, shading losses occasioned by the presence of the gridlines 16 are minimized. As a consequence, gridlines may be made wider and hence longer and the cell size may be greatly increased. Since the light-directing optical element of the present invention is provided integral with the transparent encapsulating layer 18', problems attendant upon the alignment and adherence of a separate optical element are eliminated. In accordance with the principles of the present invention, the grooved optical element is formed in the layer only after the encapsulation of the photovoltaic cell, and problems occasioned by the misalignment and/or detachment of a separate optical element are eliminated.

Figure 3:
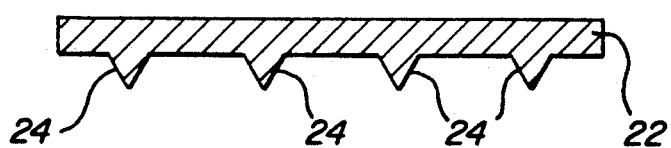
FIG. 3 is a cross-sectional view of one embossing die which may be utilized in the practice of the present invention.

In the most preferred embodiment of the present invention, the grooved optical element is formed in the transparent encapsulating layer by an embossing process employing a die generally similar to that depicted to that in cross section in FIG. 3. The die 22 of FIG. 3 is preferably fabricated from a metal, ceramic or similar durable material having good heat transfer characteristics and includes a number of groove-forming projections 24 upon the face thereof. The spacing between adjoining groove-forming portions is selected to correspond to the spacing between grid fingers in a given configuration of photovoltaic device.

In accordance with the method of the present invention, a photovoltaic cell is first provided with a top encapsulant layer, such as the polymeric layer 18 described with reference to FIG. 1. This layer is affixed by a laminating process carried out at a moderate temperature so as to avoid cross-linking the encapsulant. The structure thus produced is sufficiently rigid to withstand subsequent handling and processing. In the second step, an embossing die generally similar to that of FIG. 3 is aligned with the photovoltaic cell so that the groove-forming portions 24 thereof are aligned substantially with the grid fingers. At that time, the die 22 and cell are compressed so as to emboss the groove pattern into the transparent layer to produce a structure similar to layer 18' of FIG. 2. The process may be facilitated by heating of the embossing die 22. In general, any combination of parameters which will produce a relatively permanent deformation of the encapsulating layer may be employed. However, it has been found most preferably in accord with the present invention to utilize an encapsulant material which is cross-linkable, i.e. a material which cross links and hardens at elevated temperatures to provide a permanent structure. The aforementioned EVA polymer fulfills these criteria since it initially softens at a temperature of approximately 60° C. and subsequently cross links to form a hard layer at a temperature of approximately 140° C. These properties allow the groove-forming elements to initially penetrate and shape the layer, and subsequently harden it to cause it to retain its shape and the optical characteristics produced thereby. In a typical process employing an EVA layer, the die is heated to approximately 150° C. and a pressure of one atmosphere is maintained on the die for approximately 30 minutes. In some instances, the initial lamination and the embossing may be carried out in a one-step concerted process.

Figure 4:
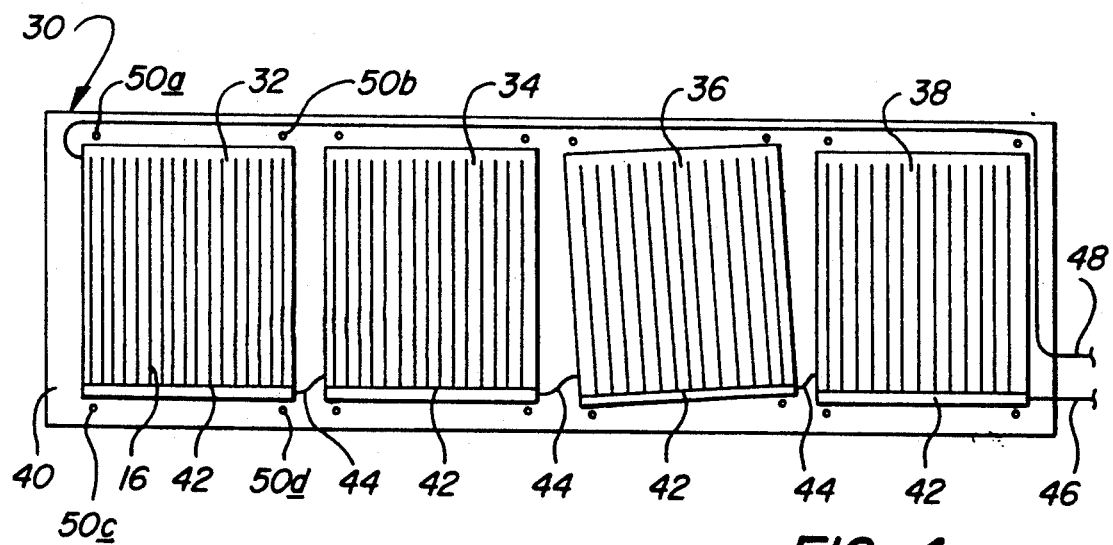
FIG. 4 is a top plan view of a large area photovoltaic module structured in accordance with the principles of the present invention.

It is frequently desirable to interconnect smaller area photovoltaic cells into a large area module so as to provide an increased voltage and/or power-producing capability. The present invention may be readily adapted for use in connection with the production of large area modules. Referring now to FIG. 4, there is shown a large area photovoltaic module 30 comprised of four individual photovoltaic cells 32,34,36,38 disposed upon a support substrate 40. The individual cells 32,34,36,38 each include a plurality of gridlines 16 formed thereupon. Each gridline is in electrical communication with a bus bar 42 disposed on the periphery of the cell. The individual cells 32,34,36,38 of the module 30 of FIG. 4 are interconnected in a series relationship by means of electrically-conductive jumpers 44 interconnecting the bus bars 42 of a first cell with the bottom electrode of an adjacent cell. The module further includes a pair of output terminals 46,48 electrically connected to the bus bar 42 of cell 38 and to the bottom electrode of cell 32. At this stage, the individual cells are laminated into a single large-area device as noted above, by moderate heat and compression (typically 60° C. when EVA is the laminant). It will be noted from the figure that the individual cells 32,34,36,38 are not all evenly aligned on the substrate 40. The present invention provides for a method of embossing the groove pattern into the cells without regard to any alignment requirements between the various cells and thereby simplifies module manufacture. It will be noted from the figure that each of the cells 32,34,36,38 has four alignment holes 50a, 50b, 50c, 50d associated therewith. After the initial lamination, these holes are punched through the substrate 40 and are oriented with regard to the orientation of the individual cell and serve as alignment guides for placement of the embossing die. Punching of the alignment holes 50, may be accomplished by the use of a template having indicia which are aligned with the grid pattern or other feature of the cell and which serve to properly position the punches.

Figure 5:
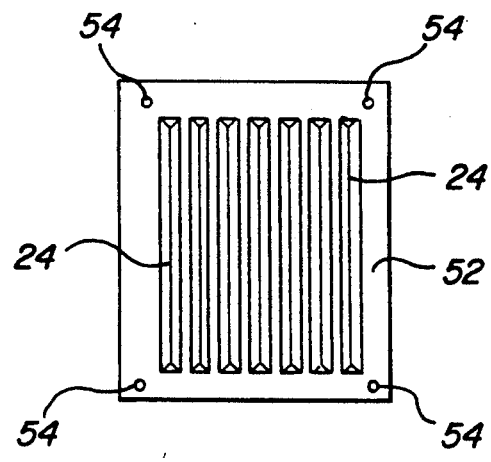
FIG. 5 is a top plan view of an embossing die of the type utilized to manufacture the module of FIG. 4.

Referring now to FIG. 5, there is shown a top plan view of an embossing die 52 generally similar to that illustrated in FIG. 3 but further including four alignment pins 54 thereupon. These pins, when placed into the corresponding pin holes in the module, serve to align the groove-forming elements 24 of the die 52 with the gridlines 16. When the module is to be completed, individual dies are placed in registry with each cell through the use of the alignment pins 54 and the entire assembly is compressed, preferably with heating, to effect groove formation.

Figure 6:
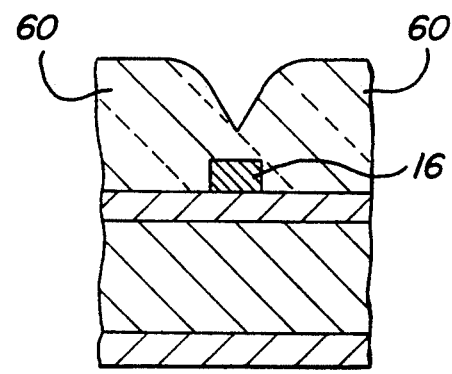
FIG. 6 is a cross-sectional view of a portion of a photovoltaic cell illustrating another configuration of a groove employed in accordance with the present invention.

While the foregoing figures depicted the grooves as being straight-sided grooves having flattened areas therebetween, the present invention may be practiced with other groove structures. For example, FIG. 6 depicts a curved groove structure having rounded, lenticular portions 60 between adjoining grid fingers 16. Many other variations will be readily apparent to one of skill in the art. For example, by selecting the width and angle of the grooves, the acceptance of illumination may be varied to account for seasonal variations in the direction of insolation. Wider grooves will tend to gather more light; however, a groove which is too wide can cause redirection of light onto adjoining grid fingers. One of skill in the art could readily control the parameters of finger spacing and groove shapes so as to achieve a minimization of shading and a maximization of power output.

Figure 7A:
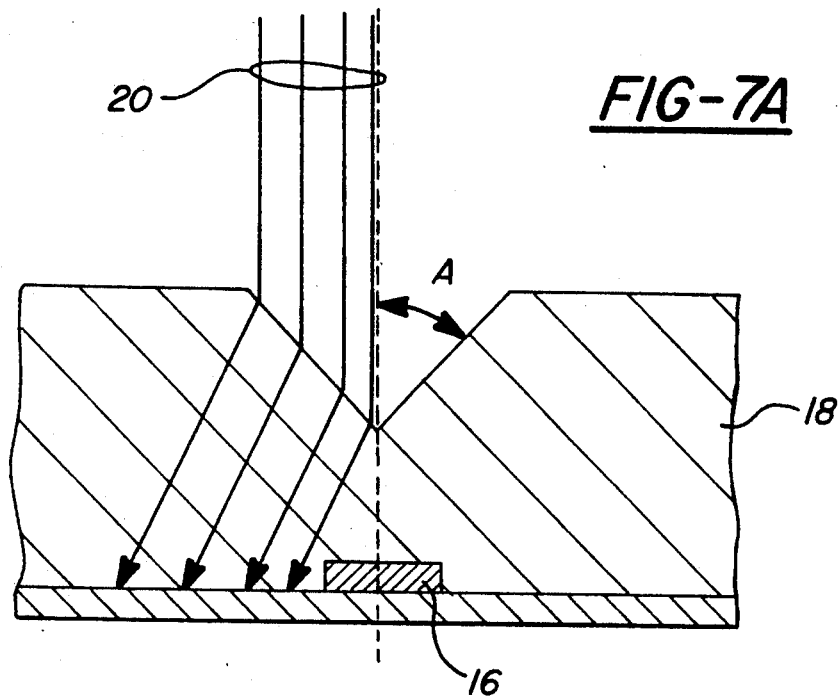
FIG. 7A is a cross-sectional view of a photovoltaic cell illustrating one particular configuration of a groove structured in accordance with the present invention.
Figure 7B:
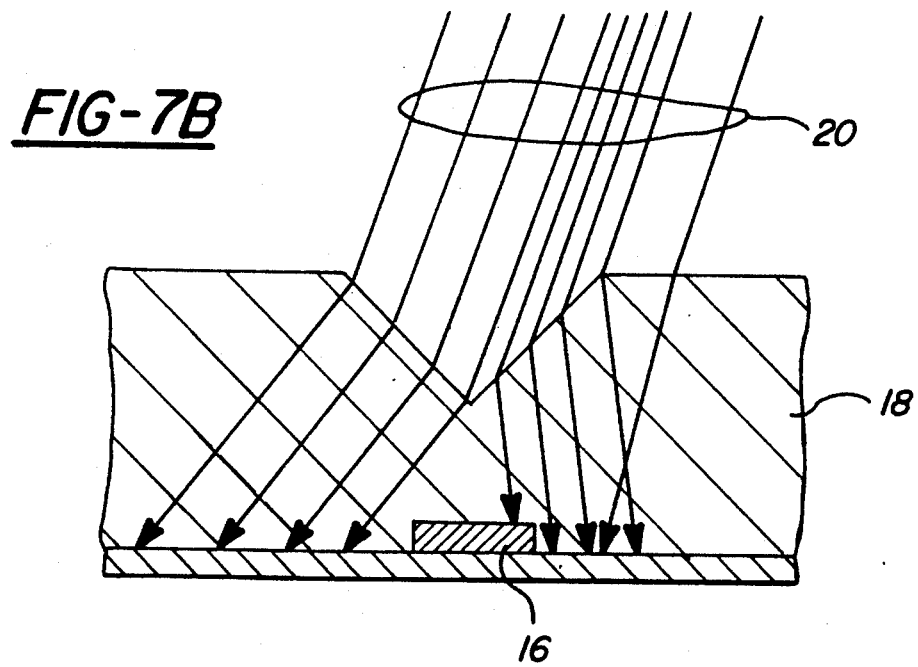
FIG. 7B is a cross-sectional view of the cell of FIG. 7A, illuminated at an oblique angle.

FIGS. 7A and 7B illustrate one particular configuration of groove width and angle as optimized to accommodate the varying angles of insolation. FIG. 7A depicts one particular configuration of photovoltaic device structured in accordance with the principles of the present invention. The device of FIG. 7A includes a top encapsulating layer 18, generally similar to those previously described and being approximately 0.95 millimeters in thickness. The device further includes a gridline 16 which is 0.3 millimeters in width. The groove formed in the encapsulant layer forms an angle "A" of approximately 42° with the perpendicular bisector of the groove indicated by the dashed line. The width of the groove as measured across the top of the layer 18 is approximately 0.8 millimeters.

As illustrated in FIG. 7A, a flux of light 20 is incident upon the device in a direction perpendicular to the top surface of the device. As will be noted, the light is directed away from the gridline 16. FIG. 7B is a depiction of the same photovoltaic device having light flux 20 incident at an angle of approximately 70° (20° off the perpendicular) to the surface thereof. It will be noted that the particular configuration of groove still functions to greatly minimize shading. Only a small portion of the light is actually incident upon the gridline 16.

The particular angle and width of a groove will depend upon the thickness of the underlying layer and the width of the gridline. Calculation of groove configuration may be readily undertaken by one of skill in the art employing basic principles of optics. Clearly, configurations other than those shown herein will be readily apparent to one of skill in the art in view of the drawings, discussion and description which are included herein.

As mentioned hereinabove, it is highly desirable to minimize reflection of light from the photovoltaic device. In accord with another aspect of the present invention, a pattern is provided which is integral with the encapsulating layer and which functions to increase light absorptions by the device.

Figure 8:
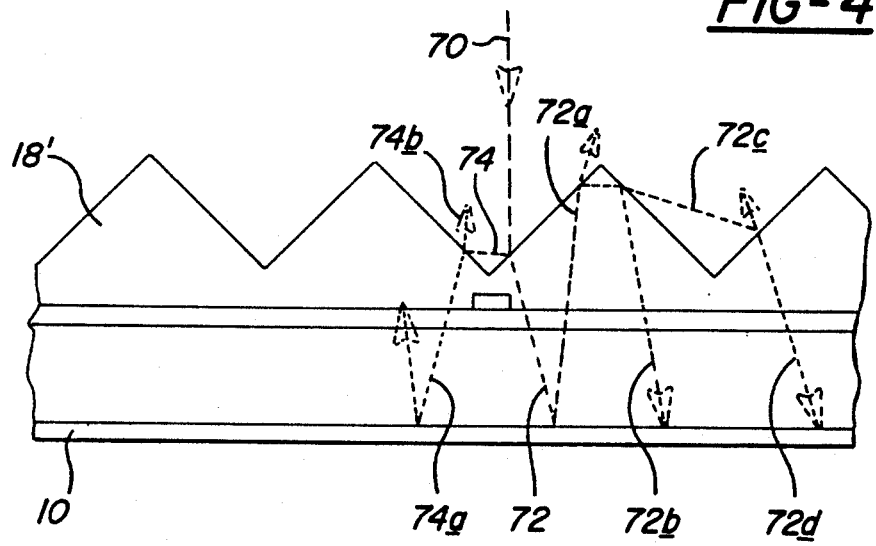
FIG. 8 is a cross-sectional view of a portion of a photovoltaic cell illustrating another configuration in accordance with the present invention which maximizes internal light absorption.

FIG. 8 depicts a cross-section of a portion of a cell having a plurality of adjacent grooves formed in the encapsulating layer 18'. A single light beam 70 (shown in dashed lines) from a photon flux is depicted to describe the enhanced light absorbing characteristics of this embodiment. As beam 70 strikes the cell, it is divided into a refracted portion 72 (shown in double dotted lines) and a reflected portion 74 (shown in fine dashed lines). It has been found that approximately 95% of the light ray incident on the angled surface of the groove is refracted and approximately 5% is reflected. The reflected ray 74 would normally be lost if incident on a planar surface; however, in the present invention it is directed at the opposite surface of the groove and, again, approximately 95% of this ray portion 74 is subsequently refracted 74a. Only a relatively small percentage of the original beam (less than 1%) is reflected a second time as shown by beam 74b which is lost. In this manner, substantially all of the light beam 70 incident on the cell is refracted into the cell for energy conversion purposes.

Figure 9:
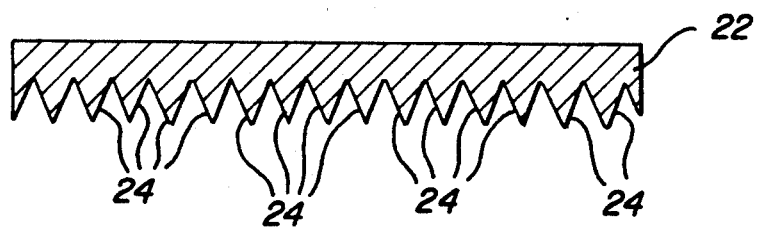
FIG. 9 is a cross-sectional view of another embossing die which may be used in the practice of the present invention configured as shown in FIG. 8.

While the foregoing figures depicted each of the grooves as being positioned relative a grid structure, the embodiment of the present invention depicted in FIG. 8 shows grooves not specifically related to grid structures. By providing a plurality of adjacent grooves, not only relative to grid structure, but substantially continuously over the surface of the cell, the efficiency of the cell is enhanced by minimizing flat surfaces generally perpendicular to the incoming light rays and thereby minimizing loss due to initial reflectance as previously described. By minimizing, and most preferably eliminating, surfaces over the active body of the cell which are parallel to the underlying components, portions of light rays which otherwise would have been reflected and lost are redirected toward another groove surface and subsequently refracted into the cell. Such a plurality of adjacent grooves can be formed as previously described using an embossing die 22 having adjacent groove forming portions 24 of a cross-section similar to that of FIG. 9.

The grooved structure of the present invention also functions to internally contain the absorbed portion of light ray 70. As shown relative to initially refracted portion 72, a portion 72a is reflected off of the back reflective electrode 10 for an additional pass through the cell. By having the surface composed of angled sections any light energy remaining after the first two passes through the cell is again redirected therethrough. For example, the remaining ray may be twice reflected off of the angled surfaces with minimal refracted loss to form portion 72b. Further, after the initial reflectance of the light ray of an angled groove surface, any portion which is refracted 72c is redirected toward an adjacent angled groove surface through an angled groove surface and thereafter subsequently refracted 72d into the cell. This internal containment occurs also with any light entering the cell, such as that entering from the initially reflected portion 74. Although cells are generally configured to utilize a substantial portion of the light energy incident thereon in the initial two passes (such as 72 and 72a), this internal containment further contributes to cell efficiency by preventing the loss of otherwise unused "excess" light energy incident thereon.

Various patterns of grooves may be used, such as those having regular or irregular patterns, including intermittent flat surfaces necessitated by the manufacturing process. Curved or planar grooved surfaces may also be used. Further, while the foregoing figures disclose a series of parallel grooves, it is envisioned that various series of grooves, such as concentric circular grooves, may be used equally advantageously in the present invention. Likewise, multiple series of grooves, such as overlapping pluralities of parallel grooves forming crossing patterns in the encapsulating material, may be used, as well.

The foregoing are illustrative of particular embodiments of the present invention and are not limitations upon the practice thereof. It is the following claims, including all equivalents, which define the scope of the invention.

We now claim:

1. A method of manufacturing a photovoltaic device having increased internal absorption of light incident thereon, said method comprising the steps of:
   providing a photovoltaic cell, said cell including a bottom electrode layer, a photovoltaic body disposed atop the bottom electrode layer, and a top electrode layer disposed atop the photovoltaic body;
   disposing a layer of embossable, transparent, organic, polymeric, encapsulating material directly atop the top electrode layer;
   providing an embossing die, said die including a plurality of groove forming elements disposed in a pattern upon the surface of said die;
   aligning the embossing die with the photovoltaic cell so that the groove forming elements thereof are in contact with the layer of polymeric encapsulating material and disposed to form a pattern of light directing grooves over substantially all of the active area of the cell;
   compressing the embossing die and photovoltaic cell so as to emboss a pattern of grooves into the layer of encapsulating material; and
   removing the embossing die, whereby there is provided a photovoltaic cell having a pattern of grooves integral with the encapsulant layer, said pattern covering substantially all of the active area of the cell and operable to direct light incident thereon so as to increase the absorption thereof.

2. A method as in claim 1, wherein the step of disposing a layer of encapsulating material atop the top electrode layer includes the further step of laminating said layer to the top electrode layer and wherein the steps of aligning and compressing are carried out after said laminating step.

3. A method as in claim 1, wherein the step of disposing said layer of organic polymeric material includes a further step of selecting said material from the group consisting of ethylene vinyl acetate, polytetrafluoroethylene, polyvinyl fluoride, polyvinyl acetate, polystyrene, polyurethane, and combinations thereof.

4. A method as in claim 1, wherein said polymeric material is a thermally cross-linkable material.

5. A method as in claim 1, including the further step of heating said embossing die.

6. A method as in claim 1, wherein the step of compressing said photovoltaic cell and die comprises compressing said cell and die at a pressure of approximately one atmosphere.

7. A method as in claim 1, wherein the step of compressing said photovoltaic cell and die further comprises maintaining said cell and die under compression for approximately 30 minutes.

8. A method as in claim 1, wherein the step of providing a photovoltaic cell comprises providing a photovoltaic cell having a photovoltaic body including at least one layer of a fluorinated, silicon alloy material.

9. A method as in claim 1, wherein said step of providing an embossing die having a plurality of groove forming elements comprises the step of providing an embossing die having a plurality of groove forming elements disposed substantially parallel to one another.

10. A method as in claim 1, wherein said step of providing an embossing die comprises the step of providing an embossing die having a plurality of groove forming elements disposed adjacent one another and configured to form a substantially continuous pattern of grooves in the encapsulant layer, which pattern is devoid of regions which are plane parallel with the underlying photoactive cell.

11. A method as in claim 1, wherein
said step of providing a photovoltaic cell further includes the step of providing a photovoltaic cell having an electrically conductive current collecting system of grid elements in electrical communication with said top electrode layer; and
said step of aligning said die comprises the step of aligning at least one of said groove forming elements in registry with a portion of the underlying grid system in said cells.

12. A method of manufacturing a large area photovoltaic module, said method comprising the steps of:
providing a plurality of photovoltaic cells, each cell including a bottom electrode, a photovoltaic body disposed in electrical communication with the bottom electrode, and a top electrode disposed atop the photovoltaic body;
disposing said plurality of cells on a support member in an electrically interconnected relationship;
disposing a layer of transparent, organic, polymeric, encapsulant material directly atop the top electrode of each of the photovoltaic cells;
laminating said encapsulant material onto said cells so as to provide a self-supporting assembly;
providing a plurality of embossing dies, each die including a plurality of groove forming elements;
aligning each of said plurality of dies with a corresponding one of said photovoltaic cells so that the pattern-forming elements thereof are in proximity to the encapsulant material and disposed to form a pattern of light directing grooves over substantially all of the active area of each cell; and
compressing said dies and laminated assembly of photovoltaic cells whereby said dies form said pattern of the transparent encapsulating layer of each cell so as to provide a light-directing optical element integral with said layer of encapsulant material covering substantially all of the active area of each cell and operable to increase internal light absorption therein.

13. A method as in claim 12, wherein the step of aligning each of said dies with a corresponding one of said cells comprises:
providing alignment pins on each of said plurality of dies;
providing corresponding alignment pin holes in said support member; and
placing said alignment pins in the said alignment pin holes.

14. A method as in claim 12, wherein the step of providing a layer of transparent, encapsulant material comprises selecting said material from the group consisting of: ethylene vinyl acetate, poly tetrafluoroethylene, polyvinyl fluoride, polyurethane, and combinations thereof.

15. A method as in claim 12, including the further step of heating said plurality of dies.

16. A method as in claim 12, wherein the step of providing a plurality of embossing dies comprises the step of providing a plurality of embossing dies, each die including a plurality of substantially parallel groove forming elements.

17. A method as in claim 16, wherein
each of said photovoltaic cells further includes an electrically conductive current collecting system of grid elements in electrical communication with said top electrode layer; and
said step of aligning said die comprises the step of aligning at least one of said groove forming elements in registry with a portion of the underlying grid system in said cells.

18. A photovoltaic cell having decreased shading, said cell comprising:
a layer of bottom electrode material;
a photovoltaic body disposed upon said layer of bottom electrode material;
a layer of top electrode material disposed upon said photovoltaic body in a spaced apart relationship with said layer of bottom electrode material so that the photovoltaic body is sandwiched therebetween; and
a layer of transparent, electrically insulating synthetic organic polymeric encapsulating material disposed directly upon said top electrode material so as to substantially cover the top electrode, said encapsulating layer having a pattern of grooves formed integrally therein, said pattern covering substantially all of the active area of the cell and operative to direct light incident thereon so that an increased amount of said light is absorbed within said photovoltaic cell as compared to photovoltaic cells without said encapsulating layer.

19. A photovoltaic cell as in claim 18, wherein said pattern in said encapsulating layer comprises a plurality of substantially parallel grooves.

20. A photovoltaic cell as in claim 18, wherein said grooves are disposed adjacent one another to form a substantially continuous pattern of grooves devoid of regions which are plane parallel to the underlying photoactive cell.

* * * * *

UNITED STATES PATENT AND TRADEMARK OFFICE
CERTIFICATE OF CORRECTION

PATENT NO. : 5,228,926
DATED : July 20, 1993
INVENTOR(S) : Troy Glatfelter, Craig Vogeli, Jon Call, Ginger Hammond It is certified that error appears in the above-indentified patent and that said Letters Patent is hereby corrected as shown below:

Column 2, Line 2, Please delete "device," and insert -- device --.

Column 7, Line 24, Please delete "preferably" and insert --preferable --.

Column 11, Line 64, After "of" (1st occurence) insert

-- grooves in--.

Signed and Sealed this

Nineteenth Day of April, 1994

Attest:

BRUCE LEHMAN

*Attesting Officer*     *Commissioner of Patents and Trademarks*